US008582358B2

(12) United States Patent
Takeyama et al.

(10) Patent No.: US 8,582,358 B2
(45) Date of Patent: Nov. 12, 2013

(54) MEMORY SYSTEM, CONTROLLER, AND METHOD FOR CONTROLLING MEMORY SYSTEM

(75) Inventors: Yoshikazu Takeyama, Kanagawa (JP); Hiroshi Sukegawa, Tokyo (JP); Yuujiro Shimada, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 181 days.

(21) Appl. No.: 13/292,431

(22) Filed: Nov. 9, 2011

(65) Prior Publication Data

US 2012/0250408 A1 Oct. 4, 2012

(30) Foreign Application Priority Data

Mar. 28, 2011 (JP) ................. 2011-070851

(51) Int. Cl.
*G11C 16/04* (2006.01)
(52) U.S. Cl.
USPC ............ 365/185.03; 365/185.08; 365/185.09; 365/189.05
(58) Field of Classification Search
USPC .............. 365/185.03, 185.08, 185.09, 189.05
See application file for complete search history.

(56) References Cited

U.S. PATENT DOCUMENTS

| 7,245,539 | B2* | 7/2007 | Oshima | 365/185.33 |
|---|---|---|---|---|
| 7,266,664 | B2* | 9/2007 | Higuchi et al. | 711/173 |
| 7,881,106 | B2 | 2/2011 | Sukegawa | |
| 2008/0062775 | A1* | 3/2008 | Oh | 365/189.05 |
| 2011/0231610 | A1* | 9/2011 | Yano et al. | 711/118 |
| 2011/0258367 | A1* | 10/2011 | Tanaka et al. | 711/103 |
| 2012/0246388 | A1* | 9/2012 | Hashimoto | 711/103 |

FOREIGN PATENT DOCUMENTS

| JP | 2001-6374 | 1/2001 |
|---|---|---|
| JP | 2005-267676 | 9/2005 |
| JP | 2008-257773 | 10/2008 |
| JP | 2009-48680 | 3/2009 |
| JP | 2010-79774 | 4/2010 |

\* cited by examiner

*Primary Examiner* — Pho M Luu
(74) *Attorney, Agent, or Firm* — Oblon, Spivak, McClelland, Maier & Neustadt, L.L.P.

(57) ABSTRACT

A memory system includes nonvolatile memory having a plurality of memory cells of storage capacity of a specified number of bits equal to or greater than two bits, and a number-of-rewrites management table managing numbers of rewrites of the memory cells. The memory system includes a controller writing to the memory cells in a number of bits in accordance with a write request of a host, dividing the memory cells into groups in dependence on storage capacity after the numbers of rewrites of the memory cells managed by the number-of-rewrites management table exceed a specified number, and writing to the memory cells of the group corresponding to storage capacity of the number of bits in accordance with the write request of the host.

20 Claims, 7 Drawing Sheets

MEMORY SYSTEM, CONTROLLER, AND METHOD FOR CONTROLLING MEMORY SYSTEM

CROSS-REFERENCE TO RELATED APPLICATIONS

This application is based upon and claims the benefit of priority from Japanese Patent Application No. 2011-070851, filed on Mar. 28, 2011; the entire contents of which are incorporated herein by reference.

FIELD

Embodiments described herein relate generally to a memory system, a controller, and a method for controlling a memory system.

BACKGROUND

Recent NAND-type flash memory has a single-level cell (SLC) capable of storing one bit (bit) in a memory device and a multi-level cell (MLC) capable of storing two bits or more in a memory device. The feature of a memory device of NAND-type flash memory is that stored data is not erased even if the power is switched off; however, there is generally a limit in the number of rewrites of a memory device, and if the number of rewrites exceeds a specified number, the possibility of causing a malfunction in a write and an erase operation is increased.

If a specific memory cell (or area) is repeatedly rewritten and exceeds the above limit, the target area may malfunction. However, if the whole memory device area is evenly rewritten, it is possible to prevent the number of rewrites of specific memory cells (or areas) from increasing suddenly. As a result, it causes an increase in total rewrite capacity as the whole NAND-type flash memory. The total rewrite capacity here indicates one obtained by multiplying written capacity by the number of rewrites.

SLC can keep a wide margin in distribution between threshold values corresponding to each data compared with MLC. Hence, it is said that an upper limit to the number of rewrites is comparatively large, and SLC is more suitable for use with the large number of rewrites. However, MLC can realize severalfold memory capacity per single device compared with SLC. Therefore, the cost per bit becomes cheaper, and MLC is very advantageous in terms of cost benefits.

For the purpose of making use of the above-mentioned merits and demerits of both SLC and MLC, an SLC area and an MLC area may be used while divided in a memory device area of NAND-type flash memory. A method for leveling the numbers of rewrites in both of the SLC area and the MLC area is devised in such a product.

DETAILED DESCRIPTION

In general, according to one embodiment of the present invention, a memory system includes nonvolatile memory having a plurality of memory cells of storage capacity of the specified number of bits equal to or greater than 2 bits, and a number-of-rewrites management table managing the numbers of rewrites of the memory cells. The memory system of the embodiment includes a controller writing to the memory cells in a number of bits in accordance with a write request of a host, after the numbers of rewrites of the memory cells managed by the number-of-rewrites management table exceed a specified number, dividing the memory cells into groups in dependence on storage capacity, and writing to the memory cells of the group corresponding to the storage capacity of the number of bits in accordance with the write request of the host.

For example, there is a case of allocating an area for writing data such as very small random data with the large number of rewrites of an SLC area having small capacity, and allocating comparatively large data with the small number of rewrites of an MLC area having large capacity. However, since data with the large number of rewrites is written to the SLC area in many cases, if the SLC area is set to be small, the number of rewrites of the SLC area reaches a limit early.

Moreover, data such as code data needs to increase reliability, and such data happen to be written to the SLC area having large capacity and set to be read-only data. On the other hand, data where a rewrite occurs is rewritten to the MLC area having comparatively small capacity. However, also in this case, a case where the number of rewrites of the MLC area exceeds a limit early can be considered.

Exemplary embodiments of a memory system will be explained below in detail with reference to the accompanying drawings. The present invention is not limited to the following embodiments.

(First Embodiment)

Figure 1:
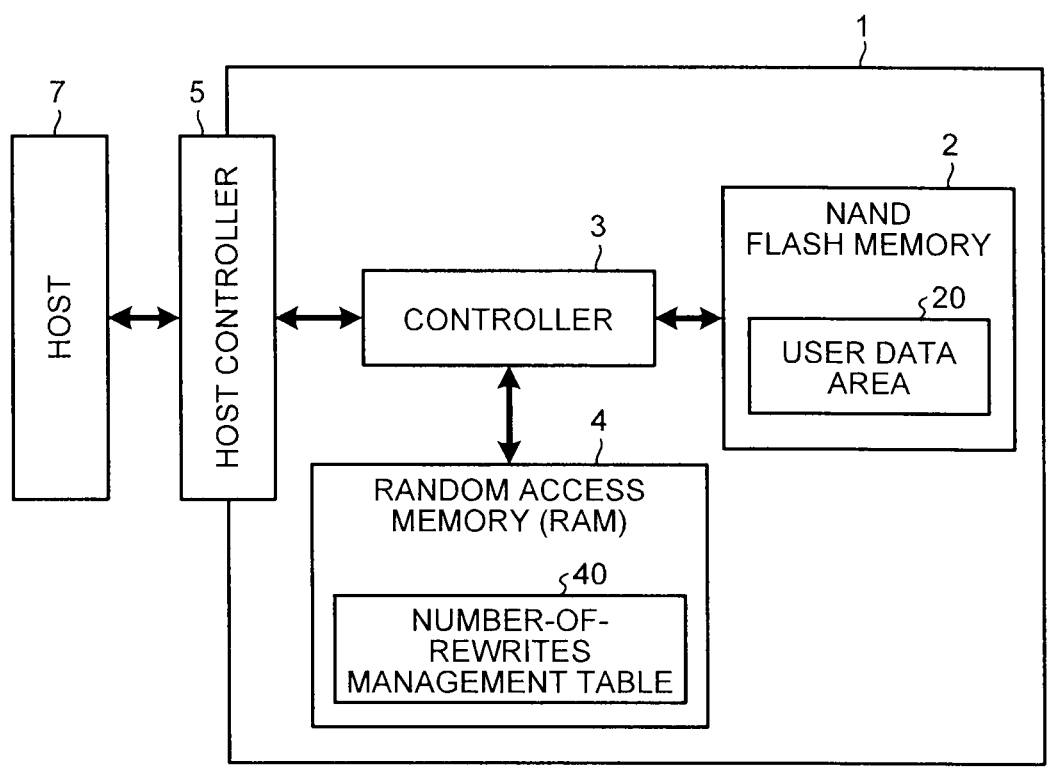
FIG. 1 is a block diagram illustrating a configuration of a memory system of a first and a second embodiment.

FIG. 1 is a block diagram illustrating a configuration of a memory system 1 of a first embodiment. As illustrated, the memory system 1 is connected to a host (Host) 7, and functions as an external storage device, for example, eMMC (Embedded Multi Media Card), of the host 7. eMMC can be used, for example, for a mobile music player, a game machine, and the like. A write/read request that the memory system 1 receives from the host 7 includes a start address of an access target defined by an LBA (Logical Block Address) and a data size showing a range of an access target area.

The memory system 1 is configured by including NAND flash memory 2 as nonvolatile semiconductor memory storing user data and an address conversion table, a controller 3 controlling data transfer between the host 7 and the NAND flash memory 2 while controlling each element in the memory system 1, random access memory (RAM) 4 as nonvolatile semiconductor memory storing at least a part of the above address conversion table temporarily, and a host controller 5 being a host interface controller that executes the control of a communication interface in between with the host 7. The NAND flash memory 2 having a plurality of memory cells has a user data area 20 storing user data written by the host 7. The random access memory 4 is configured of DRAM and SRAM, for example. The random access memory 4 has a number-of-rewrites management table 40 managing the number of rewrites of the user data area 20 in any one of pages and blocks.

The address conversion table shows a correspondence between a logical address specified by the host 7 and a physical address specifying the location of data in the NAND flash memory 2. The address conversion table is stored in the NAND flash memory 2 (unillustrated), and is held in the random access memory 4 at specified timings such as at startup of the memory system 1. If a corresponding relationship between a logical address and a physical address is updated following a data write and the like, the controller 3 updates the address conversion table held in the random access memory 4.

If the memory system 1 includes an MLC area in the NAND flash memory 2 as external specifications, the memory cell of the user data area 20 can physically be written to as both SLC and MLC. Although 4 levels, 8 levels, and the like can be considered for MLC, it is assumed in the embodiment that the memory cells of the user data area 20 can be written to as MLC that are provided as external specifications and have the largest number of levels. In the memory system 1 such as eMMC, it is determined whether to be any one of an address area corresponding to an SLC area and an address area corresponding to an MLC area in accordance with a logical address by things such as the host 7 setting a partition in a logical address (LBA) space first. Consequently, if the host 7 makes a write request to the memory system 1, it is determined whether to be any one of a write request to the SLC area and a write request to the MLC area in dependence on an LBA included in the write request.

Figure 2:
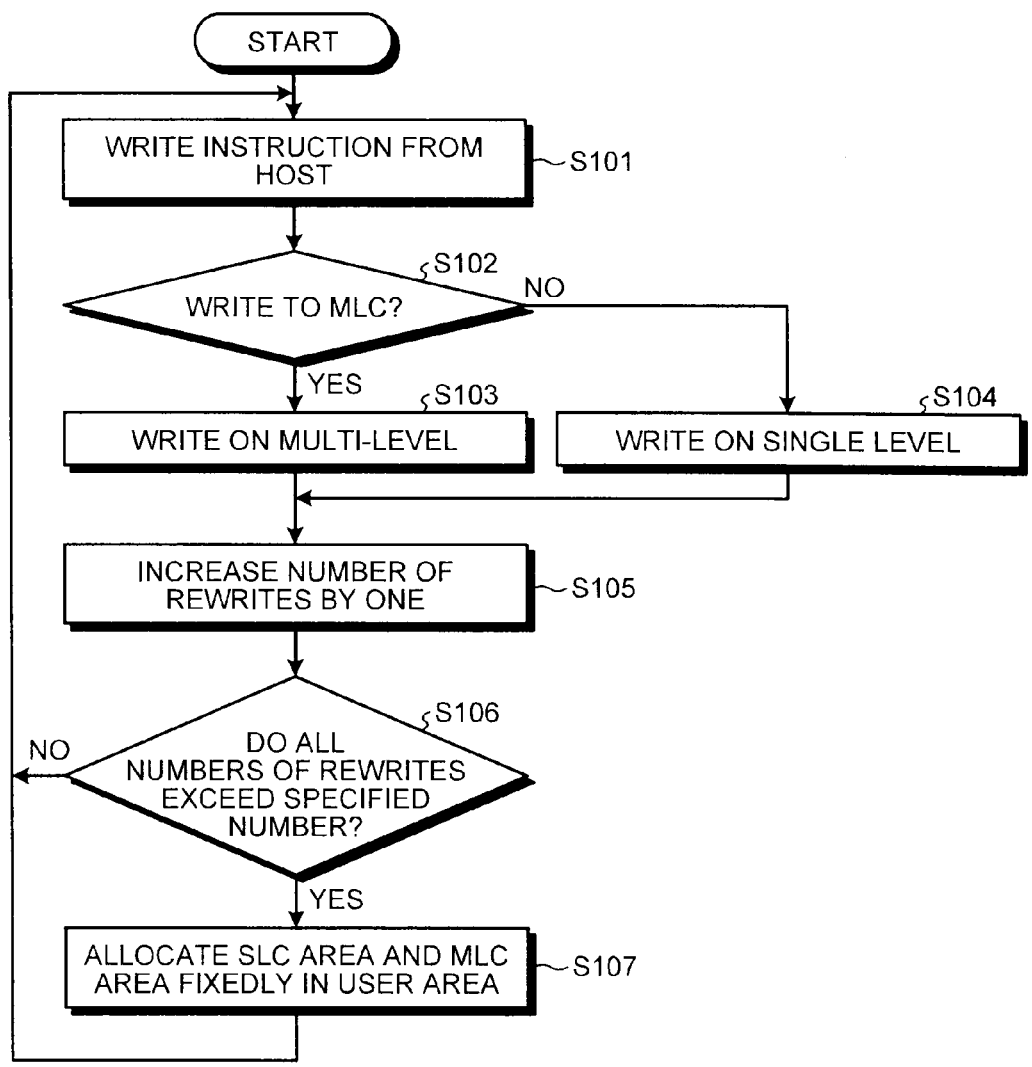
FIG. 2 is a view illustrating a flowchart showing the operation of the memory system of the first embodiment.

In the embodiment, the controller 3 executes a write on the user data area 20 of the NAND flash memory 2 in accordance with a flowchart shown in FIG. 2.

Figure 3:
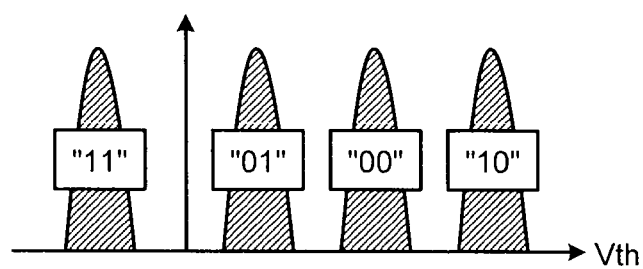
FIG. 3 is a view illustrating a state of a 2-bit write of the first embodiment.
Figure 4:
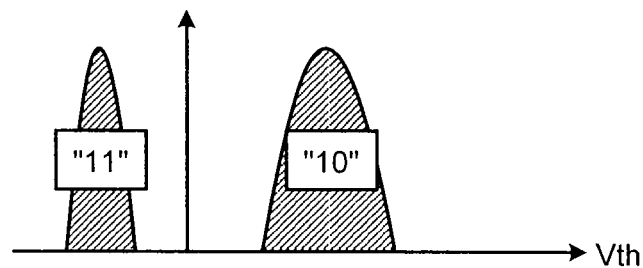
FIG. 4 is a view illustrating a state of a 1-bit write of the first embodiment.

Firstly, when a write instruction comes from the host 7 (Step S101), the write is judged whether to be a write to the MLC area (Step S102). If it is a write to the MLC area (Step S102: Yes), data is written to any memory cell of the user data area 20 on ML (multi-level), for example, in two bits as shown in FIG. 3 (Step S103). If it is not a write to the MLC area (Step S102: No), in other words, if it is a write to the SLC area, data is written to any memory cell of the user data area 20 on SL (single level), for example, in one bit as shown in FIG. 4 (Step S104).

In the embodiment, it is not distinguished in writing at the beginning by allocating a fixed area of the user data area 20 depending on whether a write is a multi level or a single level. In other words, in any write case of the above Steps S103 and S104, the writing is performed as evenly as possible at the beginning in order to avoid the occurrence of intensive rewriting of the same cell, the same page, and the same physical block by things such as using wear-leveling techniques for the user data area 20. In other words, the memory system 1 includes the MLC and the SLC area as external specifications; however, the MLC and the SLC area are not allocated fixedly to the user data area 20 at the beginning.

After Steps S103 and S104, the number of rewrites of any one of a page and a block, on which the writing was performed, of the number-of-rewrites management table 40 is increased by one (Step S105). In Step S106, it is judged afterward whether or not all the numbers of rewrites of the number-of-rewrites management table 40 exceed a specified number of rewrites. The specified number of rewrites is assumed to be a value smaller than a limit number of rewrites of when the writing to any one of a page and a block is repeated on ML (multi-level). The limit number of rewrites of when the writing is repeated on ML (multi-level) is generally smaller than a limit number of rewrites of when the writing is repeated on SL (single level). For example, assuming that the limit number of rewrites of when the writing is repeated on SL (single level) is 10000 and the limit number of rewrites of when the writing is repeated on ML (multi-level) is 1000, the specified number of rewrites is set to be 800, for example.

Figure 5:
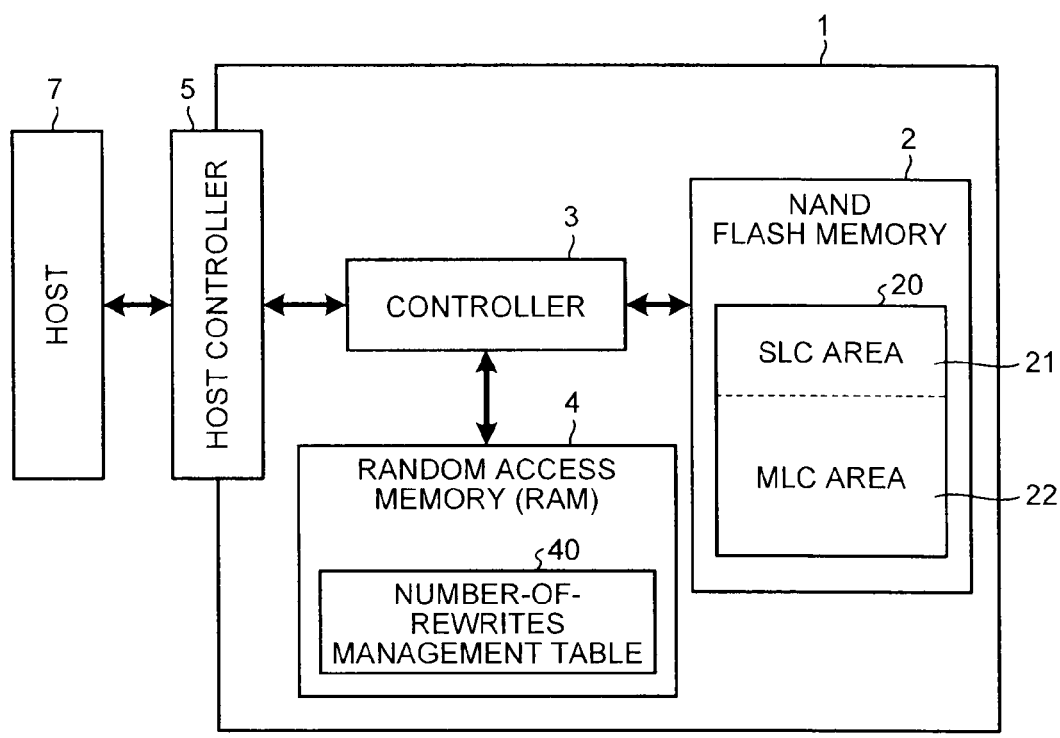
FIG. 5 is a block diagram illustrating the configuration of the memory system of the first embodiment.

If some of the numbers of rewrites of the number-of-rewrites management table 40 do not exceed the specified number of rewrites (Step S106: No), the writing is continued (Step S101). If all the numbers of rewrites of the number-of-rewrites management table 40 exceed the specified number of rewrites (Step S106: Yes), an SLC area 21 and an MLC area 22 are allocated fixedly to the user data area 20 as shown in FIG. 5 (Step S107). After Step S107, proceed to Step S101; however, the writing is performed on the MLC area 22 allocated fixedly in the following Step S103, and the writing is performed on the SLC area 21 in Step S104.

As described above, in the embodiment, until any one of all the pages or blocks of the user data area 20 exceed the above specified number of rewrites, the writing is performed without arranging a fixed area classification into the SLC and the MLC area in accordance with the number of bits of the storage capacity of the memory cell as shown in FIG. 5, and after any one of all the pages and blocks of the user data area 20 exceed the above specified number of rewrites, the SLC area 21 and the MLC area 22 are allocated fixedly to the user data area 20, and the rewriting is continued until their respective limit numbers.

A description will hereinafter be given of the effects of the embodiment with a simple numerical example. Unlike the embodiment, if the user data area 20 is allocated fixedly to the SLC area 21 and the MLC area 22 from the beginning as shown in FIG. 5, it is assumed that, for example, the SLC area 21 occupies 5% of all the memory cells of the user data area 20, the limit number of rewrites is 100, the MLC area 22 is the rest of the user data area 20, and the limit number of rewrites is 15. For example, if the whole SLC area 21 is rewritten daily for the purposes such as holding radio download data, the number of rewrites reaches the limit number in 100 days, and here the whole SLC area 21 may no longer be usable.

In contrast, in the case of the embodiment, the writing is performed evenly on the user data area 20 on a single level without distinguishing the SLC and the MLC area at the beginning as shown in FIG. 1. Additionally, it is assumed that the specified number of rewrites is 10 being smaller than 15 that is the limit number of rewrites of the MLC area. In this case, compared with the above case of performing rewriting by allocating the SLC area 21 fixedly to 5% of all the memory cells of the user data area 20, the writing is executed on the twentyfold storage area on a single level; accordingly, even if the writing is performed on a single level until 10 times that is the specified number of rewrites, it is possible to perform the 200 days worth of writing on a single level, converting to the above case. Even if the user data area 20 is allocated fixedly to the SLC area 21 and the MLC area 22 as shown in FIG. 5 after the number of rewrites of the whole user data area 20 exceeds 10, it is still possible to rewrite the SLC area 21 100−10=90 times. Moreover, the MLC area 22 too can still be rewritten until 15 times that is the limit number of rewrites.

As described above, according to the embodiment, it is made possible to provide a memory system whose effective rewrite capacity is increased under the limitations on the number of rewrites.

(Second Embodiment)

In the first embodiment, the description was given of the case where the memory system 1 has the MLC area of one type in the NAND flash memory 2 as external specifications. However, in the embodiment, the MLC area has a first MLC area made up of memory cells of 2-bit storage capacity and a second MLC area made up of memory cells of 3-bit storage capacity.

Figure 6:
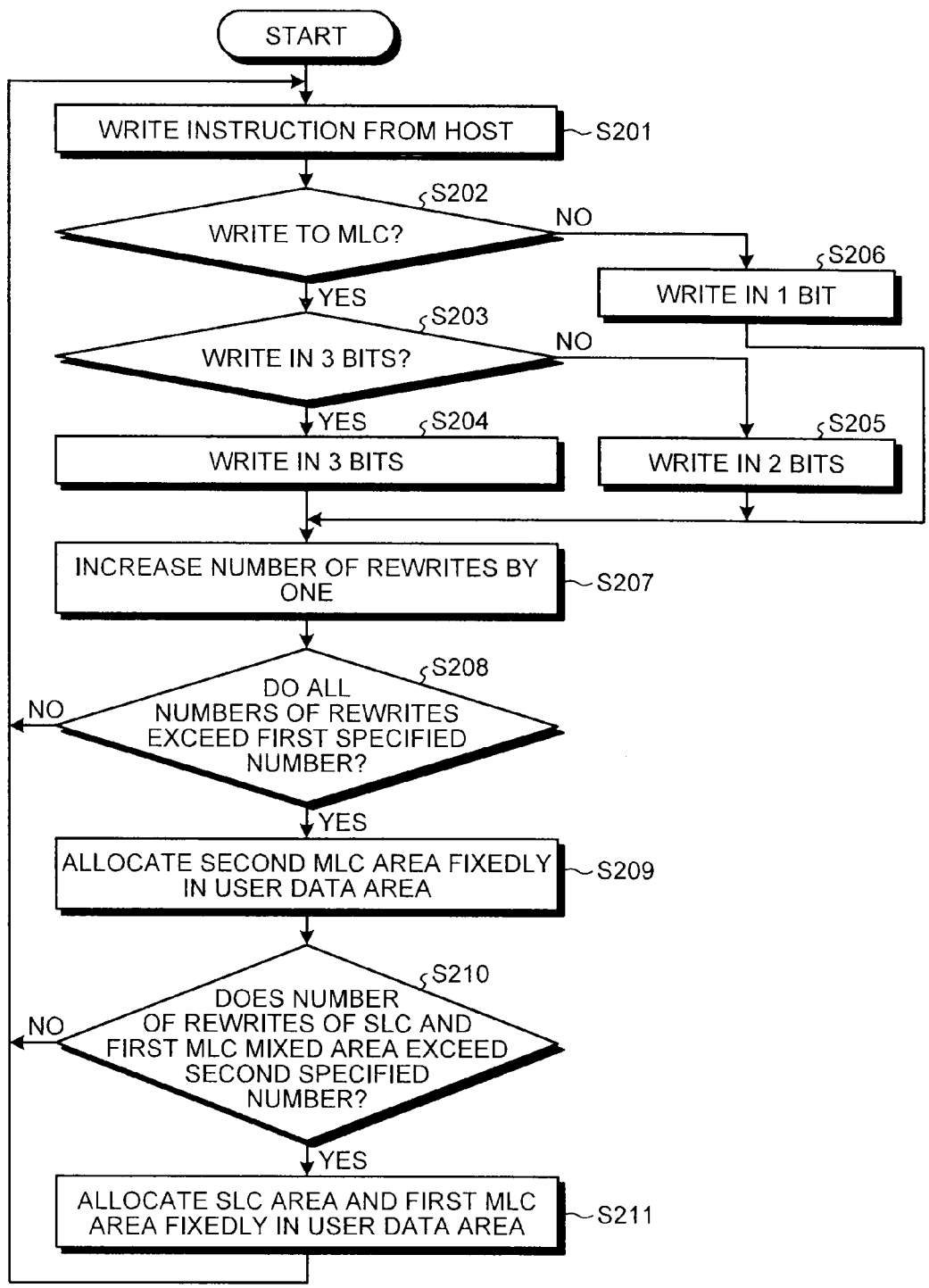
FIG. 6 is a view illustrating a flowchart showing the operation of the memory system of the second embodiment.

In the embodiment, the controller 3 executes a write on the user data area 20 of the NAND flash memory 2 in accordance with a flowchart shown in FIG. 6.

Firstly, if a write instruction comes from the host 7 (Step S201), the write is judged whether to be a write to the MLC area (Step S202). If it is a write to the MLC area (Step S202: Yes), it is further judged whether to be a 3-bit write (Step S203). If it is a 3-bit write (Step S203: Yes), data is written to any memory cell of the user data area 20 in three bits (Step S204). If it is not a 3-bit write (Step Step S203: No), data is written to any memory cell of the user data area 20 in two bits (Step S205). If it is not a write to the MLC area (Step S202: No), in other words, if it is a write to the SLC area, data is written to any memory cell of the user data area 20 on SL (single level), that is, in one bit (Step S206).

In the embodiment, in any write case of the above Steps S204, S205, and S206, the writing is performed as evenly as possible at the beginning in order to avoid the occurrence of intensive rewriting of the same cell, the same page, and the same physical block by things such as using wear-leveling techniques for the user data area 20. In other words, the memory system 1 includes the first MLC area, the second MLC area and the SLC area as external specifications; however, the first MLC area, the second MLC area and the SLC area are not allocated fixedly to the user data area 20 at the beginning unlike FIG. 1.

After Steps S204, S205 and S206, the number of rewrites of any one of a page and a block, on which a write was performed, of the number-of-rewrites management table 40 is increased by one (Step S207). In Step S208 afterward, it is judged whether or not all the numbers of rewrites of the number-of-rewrites management table 40 exceed a first specified number of rewrites. The first specified number of rewrites is assumed to be a value smaller than a limit number of rewrites of when the writing to any one of a page and a block is repeated in 3 bits. For example, assuming that a limit number of rewrites of when the writing is repeated in one bit (single level) is 10000, a limit number of rewrites of when the writing is repeated in 2 bits (multi-level) is 1000, and a limit number of rewrites of when the writing is repeated in 3 bits (multi-level) is 500, the first specified number of rewrites is set to be 400, for example.

Figure 7:
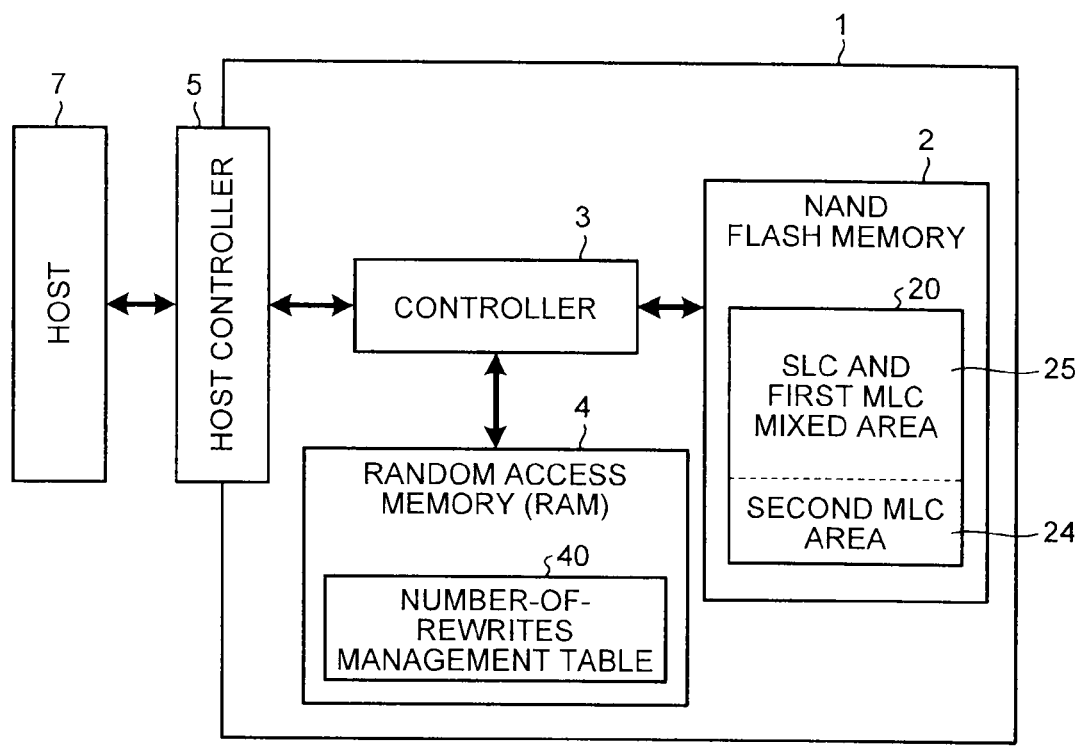
FIG. 7 is a block diagram illustrating a configuration of the memory system of the second embodiment.

If some of the numbers of rewrites of the number-of-rewrites management table 40 do not exceed the first specified number of rewrites (Step S208: No), the writing is continued without dividing the user data area 20 (Step S201). If all the numbers of rewrites of the number-of-rewrites management table 40 exceed the first specified number of rewrites (Step S208: Yes), a second MLC area 24 made up of only memory cells written in 3 bits is allocated fixedly to the user data area 20 as shown in FIG. 7 (Step S209). The remaining area of the user data area 20 is set to be an SLC and first MLC mixed area 25.

After Step S209, it is judged in Step 210 whether or not all the numbers of rewrites of the SLC and first MLC mixed area 25 exceed a second specified number of rewrites. Assuming that a limit number of rewrites of when the writing is repeated in 2 bits (multi-level) is 1000, the second specified number of rewrites is set to be 800, for example. If not all the numbers of rewrites of the SLC and first MLC mixed area 25 exceed the second specified number of rewrites (Step S210: No), proceed to Step S201; however, the writing to the second MLC area 24 allocated fixedly is continued until 500 times that is the limit number of rewrites in 3 bits in the following Step S204, and the writing evenly to the SLC and first MLC mixed area 25 is continued without arranging a fixed area classification in accordance with the number of bits in Steps S205 and S206.

Figure 8:
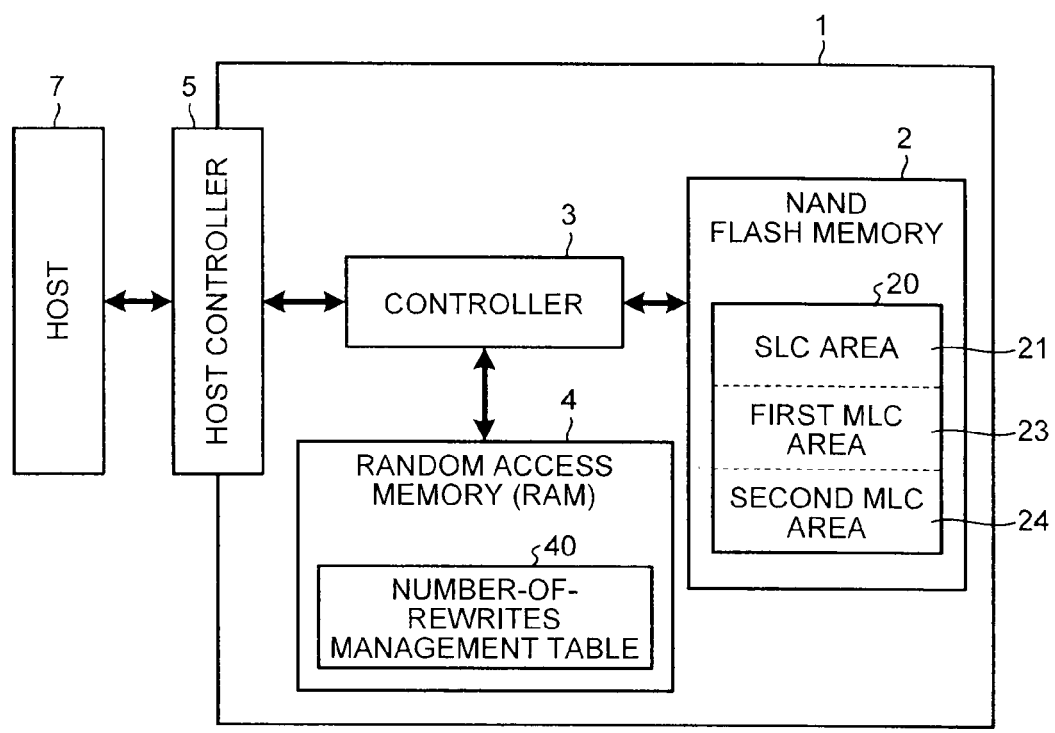
FIG. 8 is a block diagram illustrating a configuration of the memory system of the second embodiment.

In Step S210, if all the numbers of rewrites of the SLC and first MLC mixed area 25 of the number-of-rewrites management table 40 exceed the second specified number of rewrites, 800 (Step S210: Yes), the SLC area 21 and a first MLC area 23 are allocated fixedly to the SLC and first MLC mixed area 25 as shown in FIG. 8 (Step S211). After Step S211, proceed to Step S201; however, the writing is performed on the first MLC area 23 in the following Step S205, and the writing is performed on the SLC area 21 in Step S206. The 2-bit write (Step S205) is rewritable until 1000 times that is the limit number afterward. Furthermore, the 1-bit write (Step S206) is rewritable until 10000 times that is the limit number.

As described above, in the embodiment, until any one of all the pages and blocks of the user data area 20 exceed the first specified number of rewrites, 400, the writing is performed without arranging a fixed area classification in accordance with the number of bits of the storage capacity of a memory cell as shown in the user data area 20 of FIG. 1, and after any one of all the pages or blocks of the user data area 20 exceed the first specified number of rewrites, the second MLC area 24 is allocated fixedly to the user data area 20 as shown in FIG. 7, and the remaining area is set to be the SLC and first MLC mixed area 25. The second MLC area 24 continues rewriting until 500 times that is the limit number of rewrites of when repeating the writing in 3 bits (multi-level) as a memory cell area of 3-bit storage capacity afterward. The writing evenly to the SLC and first MLC mixed area 25 is continued for the 2-bit and 1-bit writes in Steps S205 and S206 without arranging a fixed area classification in accordance with the number of write bits.

Further afterward, if all the numbers of rewrites of the SLC and first MLC mixed area 25 exceed the second specified number of rewrites, 800 (Step S210: Yes), the SLC area 21 and the first MLC area 23 are allocated fixedly to the SLC and first MLC mixed area 25 as shown in FIG. 8, and the 2-bit write (Step S205) is rewritable until 1000 times that is the limit number of rewrites of two bits. Moreover, the 1-bit write (Step S206) is rewritable until 10000 times that is the limit number of rewrites of one bit.

Incidentally, in the above, the description was given as: two specified numbers of rewrites are set as shown in FIG. 6, and after the second MLC area 24 is allocated to the user data area 20 once as shown in FIG. 7, the SLC area 21 and the first MLC area 23, too, are eventually allocated as shown in FIG. 8. However, the whole user data area 20 may be allocated to the SLC area 21, the first MLC area 23 and the second MLC area 24 as shown in FIG. 8 at the time when all the numbers of rewrites exceed the first specified number of rewrites.

As described above, in a system including NAND-type flash memory, writing while dividing a memory device (memory cell) area into the SLC area and the MLC area, and performing an erase operation, the writing is performed until a specified number of rewrites without distinguishing an entire area combining the SLC area and the MLC area between the SLC area and the MLC area. A number of rewrites is set to be a value smaller than limitations on the number of rewrites of MLC whose number of rewrites is generally small. It is possible to avoid the occurrence of rewriting at an unbalanced frequency in a specific area by performing the writing on an entire memory device area, compared with the case of fixing the SLC area and the MLC area physically.

If the number of rewrites exceeds a set number, a rewrite operation is performed while dividing a rewrite area into the SLC area and the MLC area. The range of a rewrite to the memory device of the NAND-type flash memory is changed for each number of rewrites, and the area is changed for each storage capacity (the number of bits) per memory cell; accordingly, it is made possible to avoid a sudden increase in the number of rewrites in a specific area and increase effective rewrite capacity, compared with the case of performing a rewrite while dividing a rewrite area into the SLC area and the MLC are from the beginning.

Moreover, it is made possible to prevent the number of rewrites of the MLC area from exceeding the limit number by setting the number of rewrites smaller than the limit number of rewrites of the MLC area to be a specified number of rewrites and setting a rewrite range individually for SLC/MLC at the time of reaching the number.

In this manner, in a method of using NAND-type flash memory, if the number of rewrites of any one of the SLC area and the MLC area is large, it is made possible to perform hybrid data holding management while increasing effective rewrite capacity by evening out rewrites of the SLC area and the MLC area.

Incidentally, as described in the second embodiment, too, the MLC area may further have memory cells of storage capacity of the number of bits of a plurality of types, and it is not limited to the above two types, but there may be more than two. Even if so, it is needless to say that an area division can be made in accordance with the number of rewrites similarly to the above embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
nonvolatile memory having a plurality of memory cells of storage capacity of a specified number of bits equal to or greater than two bits;
a number-of-rewrites management table managing numbers of rewrites of the memory cells; and
a controller configured to write to the memory cells in a number of bits in accordance with a write request of a host, divide the memory cells into groups in dependence on storage capacity after the numbers of rewrites of the memory cells managed by the number-of-rewrites management table exceed a specified number, and write to the memory cells of the group corresponding to storage capacity of the number of bits in accordance with the write request of the host.

2. The memory system according to claim 1, wherein the specified number is smaller than a limit number of rewrites of when repeating rewriting of the memory cell in the specified number of bits.

3. The memory system according to claim 1, wherein the groups have a group made up of memory cells having storage capacity of one bit and a group made up of memory cells having storage capacity of two bits.

4. The memory system according to claim 1, wherein the groups have a group made up of memory cells having storage capacity of one bit and a plurality of groups made up of memory cells having storage capacity of two bits or more, the storage capacity being different from each other.

5. The memory system according to claim 1, wherein the groups have a group made up of memory cells having storage capacity of the specified number of bits and a group made up of memory cells having storage capacity of a number of bits less than the specified number of bits.

6. The memory system according to claim 5, configured to, after the numbers of rewrites of the memory cells exceed a second specified number larger than the specified number,
further divide the group made up of the memory cells having the storage capacity of the number of bits less than the specified number of bits into a plurality of groups in dependence on storage capacity, and
write to the memory cells of the group corresponding to the storage capacity of the number of bits in accordance with the write request of the host.

7. The memory system according to claim 5, wherein the specified number of bits is 3 (bits).

8. A controller of a memory system including nonvolatile memory having a plurality of memory cells of storage capacity of a specified number of bits equal to or greater than two bits, and a number-of-rewrites management table managing numbers of rewrites of the memory cells, the controller being configured to
write to the memory cells in a number of bits in accordance with a write request of a host,
divide the memory cells into groups in dependence on storage capacity after the numbers of rewrites of the memory cells managed by the number-of-rewrites management table exceed a specified number, and
write to the memory cells of the group corresponding to storage capacity of the number of bits in accordance with the write request of the host.

9. The controller according to claim 8, wherein the specified number is smaller than a limit number of rewrites of when repeating rewriting of the memory cell in the specified number of bits.

10. The controller according to claim 8, wherein the groups have a group made up of memory cells having storage capacity of one bit and a group made up of memory cells having storage capacity of two bits.

11. The controller according to claim 8, wherein the groups have a group made up of memory cells having storage capacity of one bit and a plurality of groups made up of memory cells having storage capacity of two bits or more, the storage capacity being different from each other.

12. The controller according to claim 8, wherein the groups have a group made up of memory cells having storage capacity of the specified number of bits and a group made up of memory cells having storage capacity of a number of bits less than the specified number of bits.

13. The controller according to claim 12, configured to, after the numbers of rewrites of the memory cells exceed a second specified number larger than the specified number,
further divide the group made up of the memory cells having the storage capacity of the number of bits less than the specified number of bits into a plurality of groups in dependence on storage capacity, and
write to the memory cells of the group corresponding to the storage capacity of the number of bits in accordance with the write request of the host.

14. The controller according to claim 12, wherein the specified number of bits is 3 (bits).

15. A method for controlling a memory system, including nonvolatile memory having a plurality of memory cells of storage capacity of a specified number of bits equal to or greater than two bits, and a number-of-rewrites management table managing numbers of rewrites of the memory cells, comprising:

writing to the memory cells in a number of bits in accordance with a write request of a host;

dividing the memory cells into groups in dependence on storage capacity after the numbers of rewrites of the memory cells managed by the number-of-rewrites management table exceed a specified number; and writing to the memory cells of the group corresponding to storage capacity of the number of bits in accordance with the write request of the host.

16. The method for controlling a memory system according to claim 15, wherein the specified number is smaller than a limit number of rewrites of when repeating rewriting of the memory cell in the specified number of bits.

17. The method for controlling a memory system according to claim 15, wherein the groups have a group made up of memory cells having storage capacity of one bit and a group made up of memory cells having storage capacity of two bits.

18. The method for controlling a memory system according to claim 15, wherein the groups have a group made up of memory cells having storage capacity of one bit and a plurality of groups made up of memory cells having storage capacity of two bits or more, the storage capacity being different from each other.

19. The method for controlling a memory system according to claim 15, wherein the groups have a group made up of memory cells having storage capacity of the specified number of bits and a group made up of memory cells having storage capacity of a number of bits less than the specified number of bits.

20. The method for controlling a memory system according to claim 19, comprising, after the numbers of rewrites of the memory cells exceed a second specified number larger than the specified number, further dividing the group made up of the memory cells having the storage capacity of the number of bits less than the specified number of bits into a plurality of groups in dependence on storage capacity, and writing to the memory cells of the group corresponding to the storage capacity of the number of bits in accordance with the write request of the host.

* * * * *